United States Patent
Baringer

(10) Patent No.: US 7,154,980 B1
(45) Date of Patent: Dec. 26, 2006

(54) FREQUENCY SYNTHESIZER WITH ON-CHIP REGISTERS

(75) Inventor: William B. Baringer, Oakland, CA (US)

(73) Assignee: Qualcomm Incorporated, San Diego, CA (US)

( * ) Notice: Subject to any disclaimer, the term of this patent is extended or adjusted under 35 U.S.C. 154(b) by 767 days.

(21) Appl. No.: 10/227,633

(22) Filed: Aug. 22, 2002

(51) Int. Cl.
*H04L 25/00* (2006.01)
*H04D 3/24* (2006.01)

(52) U.S. Cl. ..................... 375/376; 375/376
(58) Field of Classification Search ............... 375/372, 375/375, 376, 327; 327/147, 156; 329/325, 329/360
See application file for complete search history.

(56) References Cited

U.S. PATENT DOCUMENTS

| | | | | |
|---|---|---|---|---|
| 5,436,599 A | * | 7/1995 | Franson et al. ............ | 332/101 |
| 5,861,766 A | * | 1/1999 | Baumer et al. ............ | 327/105 |
| 6,392,499 B1 | * | 5/2002 | Sato ........................... | 332/100 |

FOREIGN PATENT DOCUMENTS

EP  0948138 A1 * 10/1999

* cited by examiner

*Primary Examiner*—Khai Tran
(74) *Attorney, Agent, or Firm*—Philip R. Wadsworth; Charles D. Brown; Kenyon S. Jenckes

(57) ABSTRACT

A system and method are disclosed for configuring a frequency synthesizer to generate a frequency. Configuring a frequency synthesizer to generate a frequency includes storing a plurality of value sets in a plurality of register sets; receiving a selection sequence that indicates a selected one of the plurality of value sets corresponding to a configuration parameter set to generate the frequency; selecting a register set containing the selected one of the plurality of value sets.

23 Claims, 4 Drawing Sheets

FREQUENCY SYNTHESIZER WITH ON-CHIP REGISTERS

CROSS REFERENCE TO RELATED APPLICATIONS

This application is related to co-pending U.S. patent application Ser. No. 10/227,632, entitled "DYNAMIC FREQUENCY SYNTHESIZER CONFIGURATION", by Baringer et al (filed Aug. 22, 2002) which is incorporated herein by reference for all purposes; and co-pending U.S. patent application Ser. No. 10/227,634, by Baringer, entitled "PRE-CONFIGURED FREQUENCY SYNTHESIZER" (filed Aug. 22, 2002), which is incorporated herein by reference for all purposes.

FIELD OF THE INVENTION

The present invention relates generally to communication systems. More specifically, a frequency synthesizer design is disclosed.

BACKGROUND OF THE INVENTION

In modern communication systems, frequency synthesizers are often used to establish the frequencies necessary for system operation. For example, in the receive system of a cellular phone, the local oscillators (LOs) that provide the frequencies used by the mixers in the system are commonly implemented by using frequency synthesizers.

Typically, programming a frequency synthesizer requires an external processor, such as a microcontroller, an embedded microprocessor, or a baseband modem, to write multiple data words to the synthesizer's register bank. These data words are parameters needed by the synthesizer to configure the desired output frequency. In existing implementations, the data words are written by the microcontroller over a bus, such as a serial bus, and thus the programming time of the microcontroller performing multiple register writes can be relatively lengthy.

The microcontroller load time can cause performance issues when the synthesizer needs to frequently change the frequency it is generating. For example, in a time division duplex (TDD) communication system utilizing frequency division duplex (FDD), the transceiver performs transmit and receive functions in a time interleaved manner. If the transceiver is implemented using a single synthesizer, the synthesizers registers must first be written with values appropriate for the transmit frequency to do transmission. After the transmission is complete, the register bank of the dual function synthesizer must again be written with values appropriate for the receive frequency. Over a communication period, such as the duration of a phone call, the alternation between transmitting and receiving causes the microcontroller to reload the synthesizer register values repeatedly, thus resulting in lengthy and redundant write cycles as well as unnecessary power consumption. It is desirable to have a way to reduce the redundant register writes, thereby reducing configuration time and power.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of the disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

A synthesizer design is disclosed. The design efficiently handles the initialization of the synthesizer for multiple frequencies and reduces its initialization time and power consumption.

Figure 1:
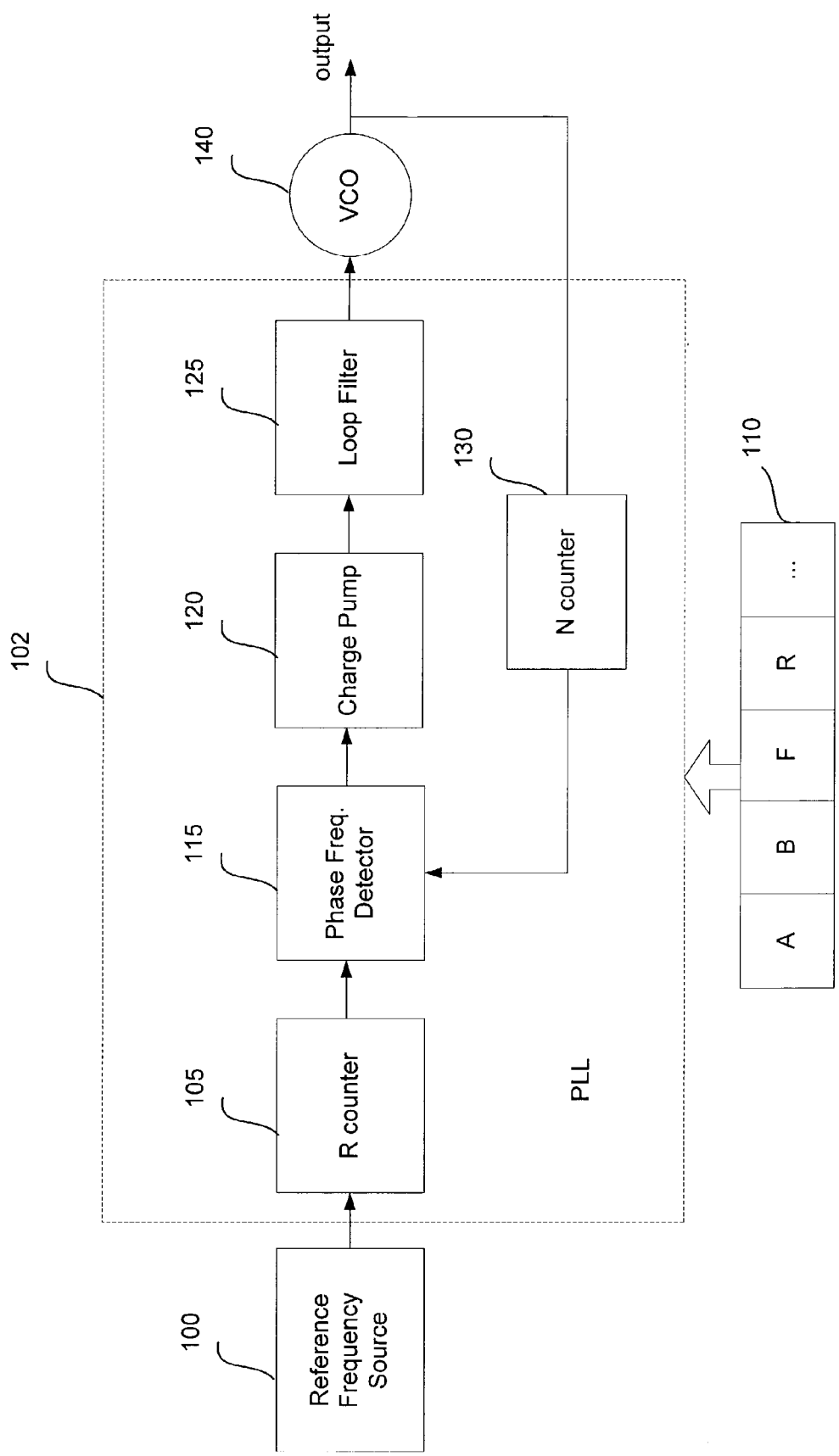
FIG. 1 is a block diagram illustrating a frequency synthesizer.

FIG. 1 is a block diagram illustrating a frequency synthesizer. Box 102 is a phase locked loop (PLL) which is essentially a feedback control system that controls the phase of voltage controlled oscillator (VCO) 140. A stable reference frequency is generated by frequency reference source 100. A temperature controlled crystal oscillator (TCXO) is one example of such a reference source. The reference frequency is divided by R by using R counter 105. The divided frequency is one input into phase frequency detector (PFD) 115, while the other input into the PFD is the output signal of VCO 140 divided by N by using N counter 130. The output of the PFD is a signal proportional to the phase difference between the two inputs. This signal is sent to charge pump 120, and then applied to loop filter 125. The filtered signal controls voltage controlled oscillator (VCO) 140. By adjusting the N and R counter values, the VCO can be configured to generate different frequencies. The N value can be expressed in terms of other parameters by using known formulas, for instance, A and B for integer-N PLL, or A, B and F for fractional-N PLL. In the embodiment shown, A, B, F and R values are loaded into a configuration parameter register 110 and then used to configure the PLL to output the desired frequency. In other embodiments, the configuration parameter register may contain other parameters used by the PLL or other parts of the synthesizer.

When a synthesizer needs to be configured to output a number of known frequencies, sets of values can be computed in advance, stored in on-chip registers that are associated with the synthesizer, and selected for use when needed. In one embodiment, the value sets are configuration parameters, and the synthesizer is configurable for outputting a number of transmit and receive frequencies. Separate on-chip registers are used to store configuration parameters for each frequency. During the configuration phase of the transmit cycle, the external source sends a selection sequence to the frequency synthesizer, and the on-chip register that stores configuration parameters corresponding to the selection sequence is chosen. The synthesizer can either copy the selected register values into a configuration parameter register, or use the register directly to configure its circuit for outputting the desired transmit frequency.

Similarly, during the configuration phase of the receive cycle, the on-chip register that stores configuration parameters corresponding to the receive frequency is selected. The values of the selected register are either copied into another configuration parameter register or used directly to configure the synthesizer to output desired receive frequency.

Figure 2:
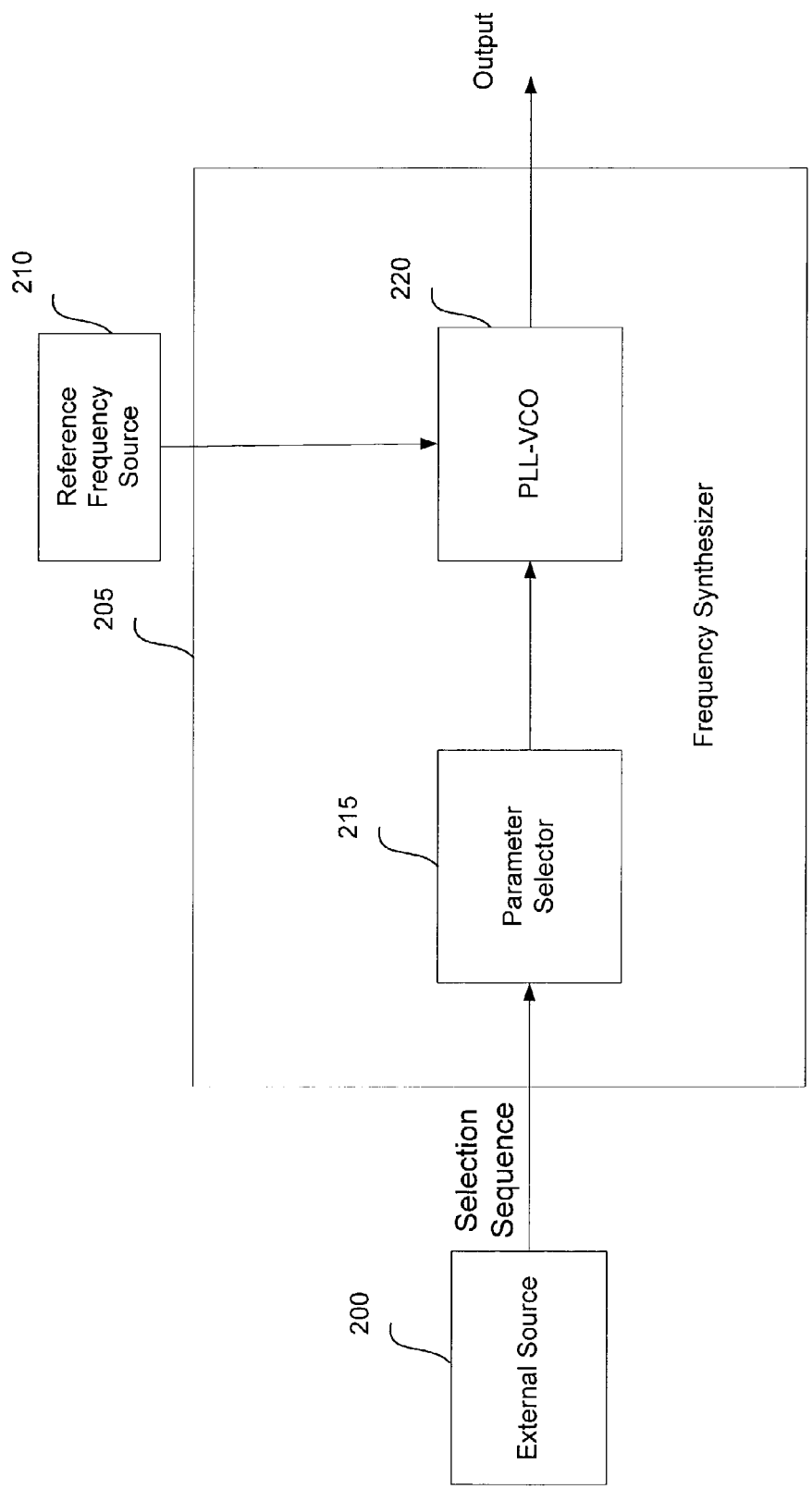
FIG. 2 is a block diagram illustrating a frequency synthesizer that is configured by an external data programming source such as a baseband modem, microprocessor or microcontroller, using a selection sequence.

FIG. 2 is a block diagram illustrating a frequency synthesizer that is configured by an external data programming source such as a baseband modem, microprocessor or microcontroller, using a selection sequence. In this embodiment, an external data programming source 200 sends a selection signal to a frequency synthesizer 205. The selection sequence is a compressed sequence that identifies the set of appropriate configuration parameters. A parameter selector 215 selects the set of appropriate synthesizer configuration parameters based on the selection sequence. The configuration parameters are sent to PLL-VCO 220, which is now configured to generate the desired output. Reference frequency source 210 provides the reference frequency for the PLL-VCO 220.

By storing the configuration parameters in on-chip registers and selecting the appropriate ones as needed, the synthesizer no longer depends on the external microcontroller (or baseband modem, microprocessor) to write multiple configuration parameters to the synthesizer's register bank. Instead, the external microcontroller writes a compressed selection sequence to the frequency synthesizer. The selection sequence has significantly fewer bits than the configuration parameters. Thus, the configuration time and power consumption of the synthesizer is reduced.

Figure 3:
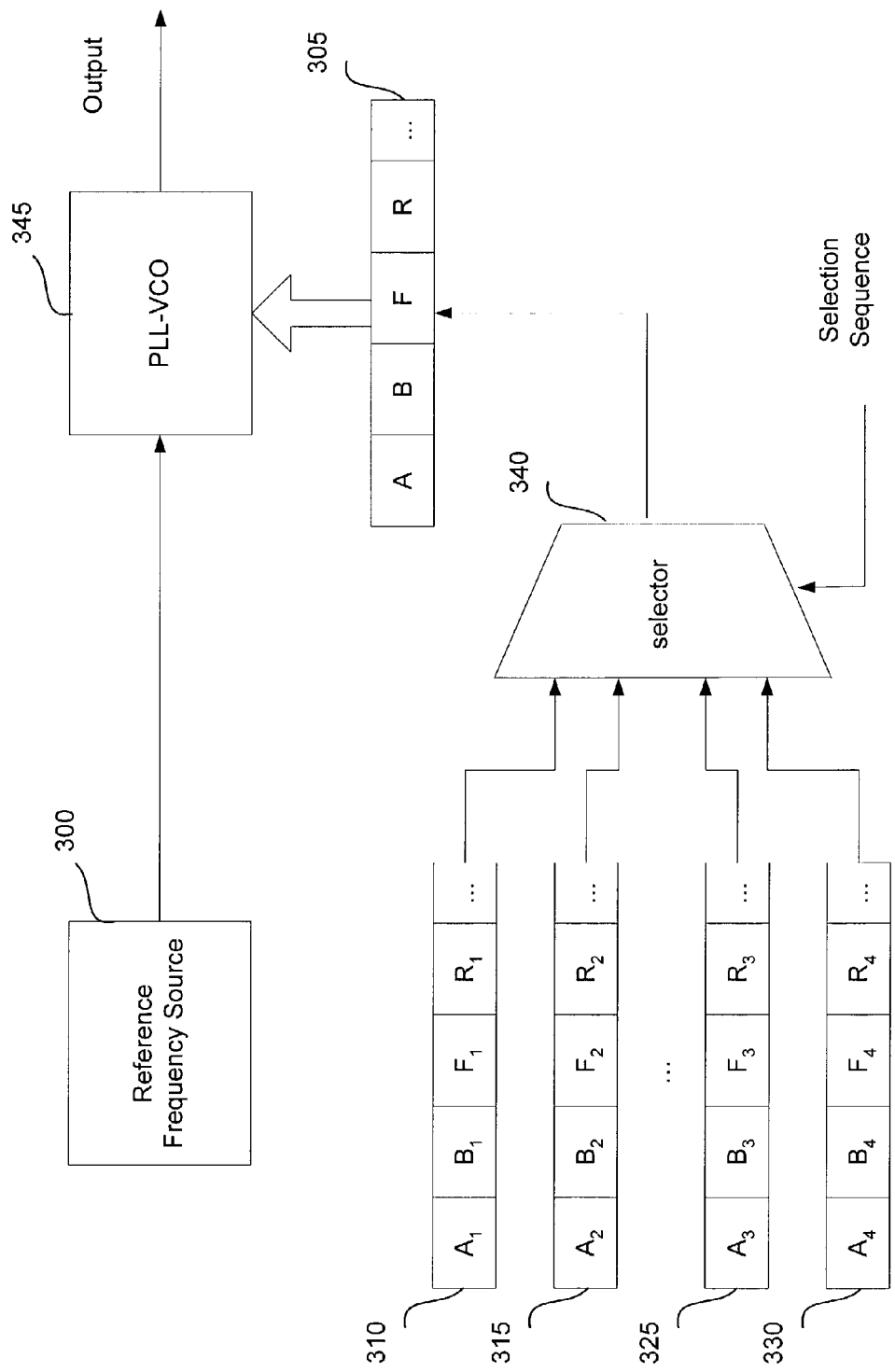
FIG. 3 is a block diagram illustrating a frequency synthesizer that uses transmit and receive registers for its configuration.

FIG. 3 is a block diagram illustrating a frequency synthesizer that uses transmit and receive registers for its configuration. On-chip registers (also referred to as register banks) 310–330 are used to store configuration parameters for various frequencies that need to be generated by the synthesizer. Note that the number of registers used may vary depending on how many different frequencies are to be generated. To configure one frequency, a selection sequence is sent to selector 340, which selects the appropriate set of registers. Selector 340 may be a multiplexer or other appropriate device. In the embodiment shown, the selected set of values is copied into configuration parameter register 305 to configure PLL-VCO 345. A reference frequency source 300 provides the reference frequency needed by the PLL. In some embodiments, the selected register set may be used directly without being copied.

In one embodiment, the synthesizer also generates frequencies appropriate for multiple control channels, in addition to the transmit and receive frequencies discussed in the previous example. Additional registers are used to store the configuration parameters for the control channel frequencies. At configuration time, a decision is made on which frequency the synthesizer should generate, and then the appropriate registers containing configuration parameters corresponding to the particular frequency are selected. The register values from the appropriate register set is copied into the synthesizer's register bank, or directly used for configuration.

In some embodiments, the synthesizer also generates other frequencies such as frequencies used for synchronization. The value sets needed to configure all these frequencies are computed and stored in separate on-chip registers. The appropriate registers are selected at configuration time, and are copied to the synthesizer's register bank or used directly to configure the desired frequency.

In certain embodiments, the synthesizer may use configuration parameters other than those used for frequency configuration. These parameters can also be stored in separate registers and selected at configuration time.

The on-chip registers can be used to store values other than the synthesizer's configuration parameters. Combining the on-chip registers with the techniques described in Baringer et at, U.S. patent application Ser. No. 10/227,632, entitled "Dynamic Frequency Synthesizer Configuration" can achieve better efficiency. The predetermined frequencies to be generated by the synthesizer are mapped to a set of values. The values that contain information that identifies the frequency are referred to as channel information (or sometimes frequency information or frequency identifier). Instead of the configuration parameters, the channel information is stored in the registers. The channel information tends to have fewer bits than the configuration parameters and requires less register space.

Figure 4:
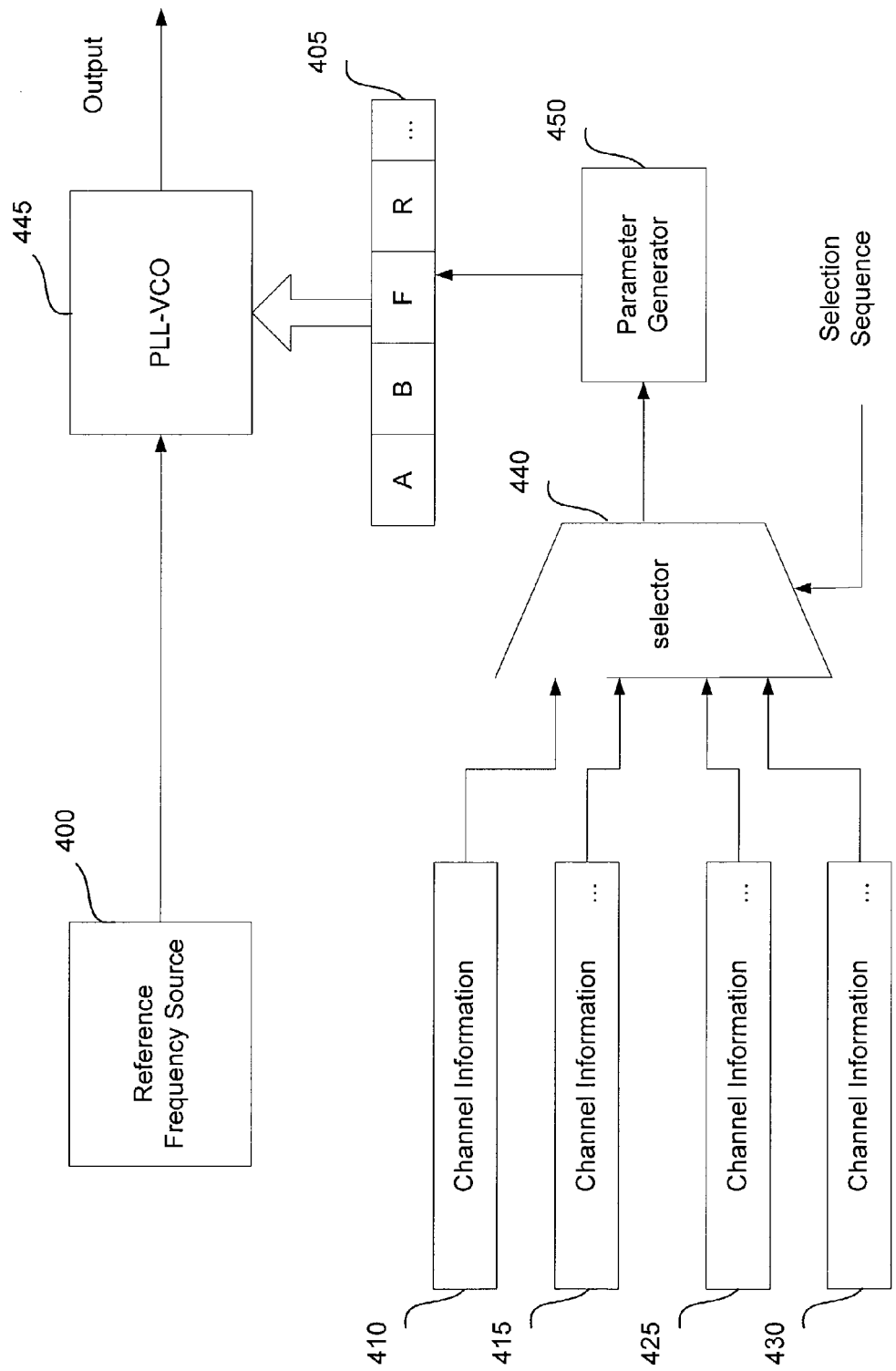
FIG. 4 is a block diagram illustrating a frequency synthesizer that uses on-chip registers to store channel information for configuration.

FIG. 4 is a block diagram illustrating a frequency synthesizer that uses on-chip registers to store channel information for configuration. On-chip registers 410–430 store channel information used for computing the corresponding configuration parameters. The number of registers used may vary depending on how many different frequencies are to be generated. To configure one frequency, a sequence containing the channel information is sent to selector 440. Selector 440 may be a multiplexer or other appropriate device. A parameter generator 450 computes the corresponding configuration parameters based on the selected channel information. The parameter generator can be implemented as a lookup table, a compute engine, or a combination thereof. In the embodiment shown, the generated values are copied into configuration parameter register 405 to configure PLL-VCO 445. A reference frequency source 400 provides the reference frequency needed by the PLL-VCO. In one embodiment, the registers are used to store Absolute Radio Frequency Channel Numbers (ARFCN) used in GSM, and the configuration parameters are looked up in a table or computed. In certain embodiments, other types of channel information may be used and stored in the registers.

To further reduce the amount of power consumed, the on-chip register sets described above can be stored in non-volatile memory storage, such as non-volatile RAM or a power supplied memory storage, to persist the values that would be lost if stored in volatile memory. For example, different embodiments use NVRAM circuitry, EEPROM, flash PROM, battery-backed RAM and capacitive backed RAM. These types of memory are writable and remain intact when the rest of the device is powered off. When the synthesizer is powered on again, it can directly use the stored register values without doing extra register loads.

Allowing the synthesizer to be powered off when it is not active can save both initialization time and power.

A synthesizer design has been disclosed. By using a selection sequence, the amount of data that needs to be sent from the external source to initiate the configuration is reduced. The configuration parameters are precomputed and stored in separate registers to be selected for outputting desired frequency. The precomputed configuration parameters can also be stored in non-volatile storage RAM. A combination of separate register and non-volatile storage RAM techniques may be used to achieve short configuration time and reduce power consumption.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method for configuring a frequency synthesizer to generate a frequency, comprising:
    storing a plurality of value sets in a plurality of register sets;
    receiving a selection sequence that indicates a selected one of the plurality of value sets corresponding to the frequency;
    selecting a register set containing the selected one of the plurality of value sets;
    obtaining a set of configuration parameters indicative of at least one frequency divider ratio based on a value set from the selected register set; and
    providing the set of configuration parameters to a phase locked loop (PLL) to generate the frequency.

2. A method of configuring a frequency synthesizer as recited in claim 1 wherein the plurality of register sets are on-chip register sets that are located on the frequency synthesizer.

3. A method of configuring a frequency synthesizer as recited in claim 1 wherein the plurality of value sets are a plurality of sets of configuration parameters that correspond to a plurality of output frequencies.

4. A method of configuring a frequency synthesizer as recited in claim 1 wherein the plurality of value sets are a plurality of sets of configuration parameters that correspond to a plurality of output frequencies and wherein the selecting the register set further includes writing the selected one of the plurality of value sets to a plurality of configuration parameter registers.

5. A method of configuring a frequency synthesizer as recited in claim 1 wherein the plurality of value sets are a plurality of sets of configuration parameters that correspond to a plurality of output frequencies and wherein the selecting the register set further includes connecting the selected register set to a plurality of configuration parameter registers.

6. A method of configuring a frequency synthesizer as recited in claim 1 wherein the synthesizer is a single chip and wherein the plurality of register sets associated with the frequency synthesizer are on the single chip.

7. A method of configuring a frequency synthesizer as recited in claim 1 wherein the plurality of value sets are a plurality of sets of configuration parameters that correspond to a plurality of desired output frequencies; and
    wherein the plurality of desired output frequencies are used for transmit, receive, control or synchronization purposes or combinations thereof.

8. A method of configuring a frequency synthesizer as recited in claim 1 wherein the plurality of value sets are stored in non-volatile memory.

9. A method of configuring a frequency synthesizer as recited in claim 1 wherein the plurality of value sets are channel information; and
    the method further includes generating the set of configuration parameters using the channel information.

10. A method of configuring a frequency synthesizer as recited in claim 1 wherein the plurality of value sets are channel information; and
    the method further includes generating the set of configuration parameters using the channel information and a lookup table.

11. A method of configuring a frequency synthesizer as recited in claim 1 wherein the plurality of value sets are channel information stored in non-volatile memory.

12. A method of configuring a frequency synthesizer as recited in claim 1 wherein the selection sequence is sent from a baseband modem, a microcontroller, a microprocessor, or similar external device.

13. A frequency synthesizer comprising:
    a plurality of register sets for storing a plurality of value sets; and
    a parameter selector configured to receive a selection sequence that indicates a selected one of the plurality of value sets corresponding to a desired frequency, to select a register set containing one of the plurality of value sets, to obtain a set of configuration parameters indicative of at least one frequency divider ratio based on a value set from the selected register set, and to provide the set of configuration parameters to a phase locked loop (PLL) to generate the desired frequency.

14. A frequency synthesizer as recited in claim 13 wherein the plurality of value sets are a plurality of sets of configuration parameters that correspond to a plurality of output frequencies.

15. A frequency synthesizer as recited in claim 13 wherein the plurality of value sets are a plurality of sets of configuration parameters that correspond to a plurality of output frequencies and wherein the parameter selector writes the selected one of the plurality of value sets to a plurality of configuration parameter registers.

16. A frequency synthesizer as recited in claim 13 wherein the plurality of value sets are a plurality of sets of configuration parameters that correspond to a plurality of output frequencies and wherein the parameter selector connects the selected register set to a plurality of configuration parameter registers.

17. A frequency synthesizer as recited in claim 13 wherein the synthesizer is a single chip and wherein the plurality of register sets associated with the frequency synthesizer are on the single chip.

18. A frequency synthesizer as recited in claim 13 wherein the plurality of value sets are a plurality of sets of configuration parameters that correspond to a plurality of desired output frequencies; and
    wherein the plurality of desired output frequencies are used for transmit, receive, control or synchronization purposes or combinations thereof.

19. A frequency synthesizer as recited in claim 13 wherein the plurality of value sets are stored in non-volatile memory.

20. A frequency synthesizer as recited in claim 13 wherein the plurality of value sets are channel information and the synthesizer further includes a parameter generator that generates the set of configuration parameters using the channel information.

21. A frequency synthesizer as recited in claim 13 wherein the plurality of value sets are channel information; and
the synthesizer further includes a parameter generator that generates the set of configuration parameters using the channel information; and
wherein the parameter generator includes a lookup table.

22. A frequency synthesizer as recited in claim 13 wherein the plurality of value sets are channel information stored in non-volatile memory.

23. A frequency synthesizer as recited in claim 13 wherein the selection sequence is received from a baseband modem, a microcontroller, a microprocessor, or similar external device.

* * * * *